(12) United States Patent
Guan et al.

(10) Patent No.: US 11,764,210 B2
(45) Date of Patent: Sep. 19, 2023

(54) ELECTROSTATIC PROTECTION CIRCUIT AND ELECTRONIC DEVICE

(71) Applicant: INNOSCIENCE (ZHUHAI) TECHNOLOGY CO., LTD., Zhuhai (CN)

(72) Inventors: Yaobin Guan, Zhuhai (CN); Jianjian Sheng, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 0 days.

(21) Appl. No.: 17/844,755

(22) Filed: Jun. 21, 2022

(65) Prior Publication Data

US 2022/0320077 A1 Oct. 6, 2022

Related U.S. Application Data

(63) Continuation of application No. 16/842,783, filed on Apr. 8, 2020, now Pat. No. 11,398,470.

(30) Foreign Application Priority Data

May 15, 2019 (CN) .......................... 201910406827.5

(51) Int. Cl.
*H01L 27/02* (2006.01)
*H02H 9/04* (2006.01)
*H03K 17/081* (2006.01)

(52) U.S. Cl.
CPC ...... *H01L 27/0292* (2013.01); *H01L 27/0281* (2013.01); *H01L 27/0288* (2013.01); *H02H 9/046* (2013.01); *H03K 17/08104* (2013.01)

(58) Field of Classification Search
CPC ............ H01L 27/0292; H01L 27/0281; H01L 27/0288; H01L 27/0285; H01L 27/0266; H02H 9/046; H03K 17/08104
USPC ........................................... 361/56
See application file for complete search history.

(56) References Cited

U.S. PATENT DOCUMENTS

| | | | |
|---|---|---|---|
| 2007/0058307 A1* | 3/2007 | Mergens | H01L 27/0262 257/E29.225 |
| 2017/0243862 A1* | 8/2017 | Parthasarathy | H01L 29/7783 |
| 2019/0237456 A1* | 8/2019 | Lai | H03K 17/08104 |

* cited by examiner

*Primary Examiner* — Thienvu V Tran
*Assistant Examiner* — Sreeya Sreevatsa
(74) *Attorney, Agent, or Firm* — McCoy Russell LLP

(57) ABSTRACT

The present disclosure provides an electrostatic protection circuit and an electronic device. The electrostatic protection circuit is connected to a first end point and a second end point of a power device. The electrostatic protection circuit is configured to allow bilateral electrostatic protection between the first end point and the second end point of the power device. The power device includes a transverse high-electron-mobility transistor (HEMT).

16 Claims, 13 Drawing Sheets

ELECTROSTATIC PROTECTION CIRCUIT AND ELECTRONIC DEVICE

CROSS REFERENCE TO RELATED APPLICATIONS

This application is a continuation application of U.S. application Ser. No. 16/842,783, filed on 8 Apr. 2020, which claims priority of CN Patent Application No. 201910406827.5 filed on May 15, 2019, the disclosure of which is hereby incorporated by reference in its entirety.

BACKGROUND OF THE INVENTION

1. Technical Field

The disclosure relates to an electrostatic protection circuit and an electronic device, and particularly to an electrostatic protection circuit having III-V high-electron-mobility transistors and an electronic device having the same.

2. Description of the Related Art

A direct bandgap semiconductor component, for example, comprising a semiconductor component of an III-V material or III-V compound (category: III-V compounds), can be operated or worked under multiple conductions or environments (for example different voltages and frequencies).

The above semiconductor component may include a heterojunction bipolar transistor (HBT), a heterojunction field effect transistor (HFET), a high-electron-mobility transistor (HEMT), or a modulation-doped FET (MODFET).

SUMMARY

In one or more embodiments, an electrostatic protection circuit is connected to a first end point and a second end point of a power device. The electrostatic protection circuit is configured to allow bilateral electrostatic protection between the first end point and the second end point of the power device. The power device includes a transverse high-electron-mobility transistor (HEMT). The electrostatic protection circuit further includes a first transistor, a second transistor, a third transistor, and a first resistor. The first transistor has a source, a gate and a drain. The source of the first transistor is connected to the first end point of the power device, and the gate of the first transistor is connected to the drain of the first transistor. The second transistor has a source, a gate and a drain. The source of the second transistor is connected to the first end point of the power device. The gate of the second transistor is connected to the drain of the first transistor. The drain of the second transistor is connected to the second end point of the power device. The third transistor has a source, a gate and a drain. The drain of the third transistor is connected to the second end point of the power device. The first resistor is connected between the source of the third transistor and the first end point of the power device. The first end point of the power device is the source of the transverse HEMT, and the second end point of the power device is the drain of the transverse HEMT.

In one or more embodiments, an electronic device includes a power device and an electrostatic discharge (ESD) protection circuit. The power device includes a transverse high-electron-mobility transistor (HEMT) having three end points. The ESD protection circuit is connected between at least two of three end points of the power device, and configured to provide a bilateral current path between the two end points. The ESD protection circuit includes a first transistor, a second transistor, a third transistor, and a first resistor. The first transistor has a source, a gate and a drain. The source of the first transistor is connected to the first end point of the power device, and the gate of the first transistor is connected to the drain of the first transistor. The second transistor has a source, a gate and a drain. The source of the second transistor is connected to the first end point of the power device. The gate of the second transistor is connected to the drain of the first transistor. The drain of the second transistor is connected to the second end point of the power device. The third transistor has a source, a gate and a drain. The drain of the third transistor is connected to the second end point of the power device. The first resistor is connected between the source of the third transistor and the first end point of the power device. The first end point of the power device is the source of the transverse HEMT, and the second end point of the power device is the drain of the transverse HEMT.

BRIEF DESCRIPTION OF THE DRAWINGS

The aspects of the disclosure will become more comprehensible from the following embodiments made with reference to the accompanying drawings. It should be noted that, various features may not be drawn to scale. The sizes of the various features may be increased or reduced arbitrarily for the purpose of clear description.

DETAILED DESCRIPTION

Figure 1:
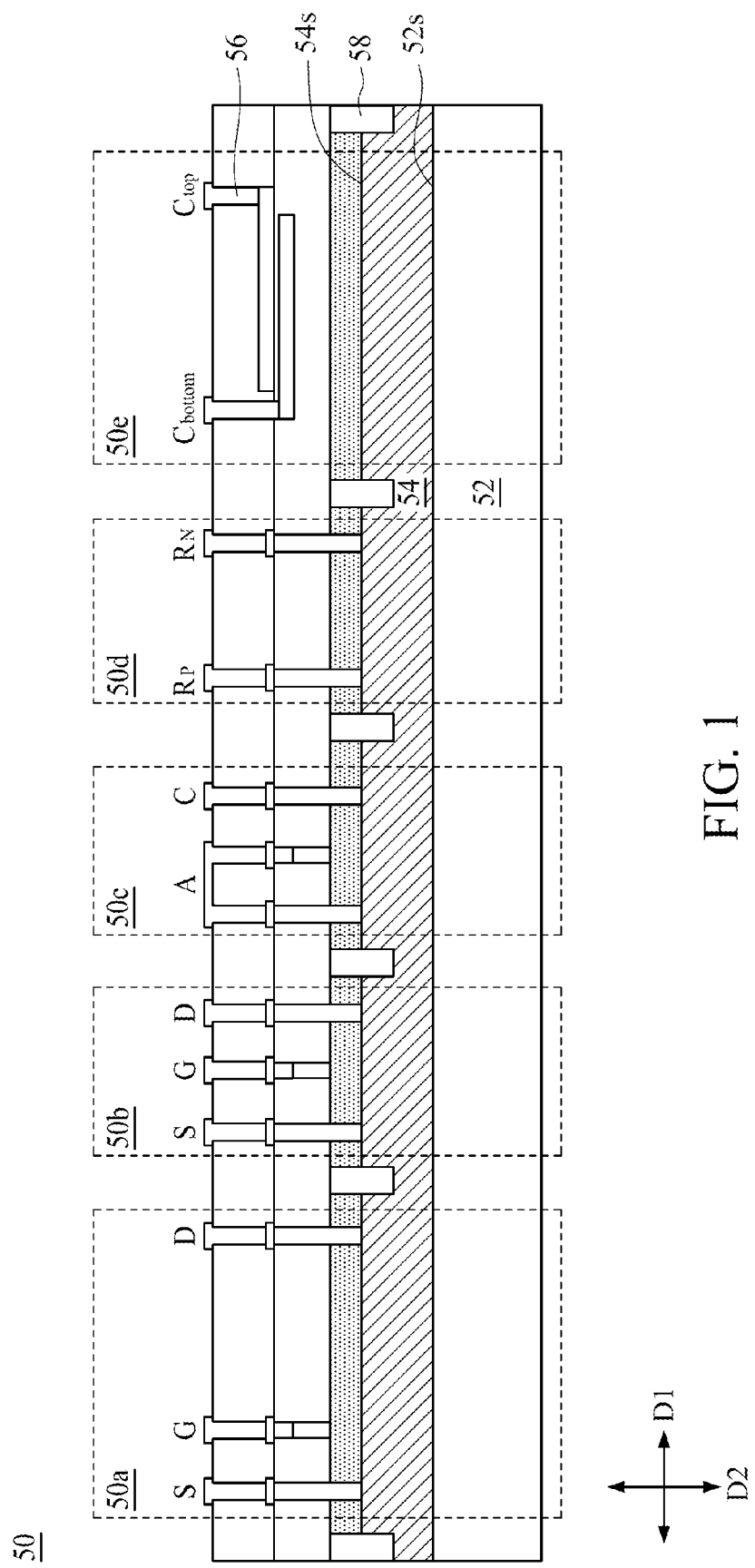
FIG. 1 is a side view of an electronic device according to some embodiments of the disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

A direct bandgap material, for example an III-V compound, may include but not limited to, for example, gallium arsenide (GaAs), indium phosphide (InP), gallium nitride (GaN), indium gallium arsenide (InGaAs) and aluminum gallium arsenide (AlGaAs).

FIG. 1 is a side view of an electronic device according to some embodiments of the disclosure.

As shown in FIG. 1, the electronic device 50 may include a substrate 52, an III-V layer 54 and a conductor structure 56.

The substrate 52 may include, for example, but not limited to, silicon (Si), doped silicon (doped Si), silicon carbide (SiC), silicide germanium (SiGe), gallium arsenide (GaAs) or other semiconductor materials. The substrate 52 may include, for example, but not limited to, sapphire, silicon on insulator (SOI) or other proper materials. In some embodiments, the substrate 52 may also include a doped region (not shown in FIG. 1), for example, a p-well and an n-well.

The III-V layer 54 may be arranged on the substrate 52. The III-V layer 54 may include, for example, but not limited to, gallium nitride (GaN), aluminum gallium nitride (AlGaN), indium gallium nitride (InGaN) and other III-V compounds. In some embodiments, the III-V layer 54 may include, for example, but not limited to, III nitrides, for example, compound InxAlyGa1-x-yN (wherein x+y≤1), compound AlyGa(1-y)N (wherein y≤1). In some embodiments, the III-V layer 54 may include, for example, but not limited to, a p type dopant, an n type dopant or other dopants. In some embodiment, the III-V layer 54 may include a single-layer structure, a multi-layer structure and/or a heterostructure. The III-V layer 54 may have a heterojunction, and two-dimensional electron gas (2DEG) regions (not shown in FIG. 1) are formed in the III-V layer 54 due to polarization of heterojunctions of different nitrides.

The conductor structure 56 is arranged on the III-V layer 54. The conductor structure 56 may include metals, for example, but not limited to, titanium (Ti), Tantalum (Ta), tungsten(W), aluminum (Al), cobalt (Co), cuprum (Cu), nickel (Ni), platinum (Pt), plumbum (Pb), molybdenum (Mo) and compounds (for example but not limited to, titanium nitride (TiN), tantalum nitride (TaN), other conductive nitrides or conductive oxides) thereof, metal alloys (for example aluminum copper alloy (Al—Cu)), or other proper materials.

In some embodiments, the conductor structure 56 may include a gate G, a source S, a drain D, capacitor terminals $C_{bottom}$ and $C_{top}$, resistor terminals $R_p$ and $R_N$, a metal-oxide semiconductor field-effect transistor (MOSFET) terminal A, or other conductor structures.

A plurality of conductor structures 56 may form different functional components, such as transistors 50a and 50b (such as power device), a rectifier 50c, a resistor 50d and a capacitor 50e. The electronic device 50 may also include an insulation region 58 isolating various functional components. Although the conductor structures 56 and various functional components formed by the conductor structures 56 are described as being arranged at specific positions in FIG. 1, selection, configuration and quantity of the conductor structure 56 and various functional components can vary in other embodiments of the disclosure depending on design specifications.

As shown in FIG. 1, the transistors 50a and 50b include three end points: a gate G, a source S and a drain D. In some embodiments, the transistors 50a and 50b may include high-electron-mobility transistors (HEMT), wherein the HEMT may include an enhancement mode HEMT (E-HEMT) and a depletion mode HEMT (d-HEMT). In some embodiments, the transistor 50a may have a relative high voltage (for example a voltage between the gate and the drain) component (for example a component which is applicable to a voltage of equal to or larger than 600 V) and relative low voltage component (for example a component which is applicable to a voltage of 10 V-100 V). In some embodiments, the transistors 50a and 50b may include horizontal/transverse HEMTs. That is, as shown in FIG. 1, the electronic device 50 includes a gate G, a source S and a drain D which are horizontally arranged on the surface of the substrate 52. In some embodiments, the current flow directions of the transistors 50a and 50b are parallel to the surface of the structure. In some embodiments, in the transistor 50a, current flows horizontally or laterally between the drain D and the source S.

In some embodiments, the resistor 50d may be a 2DEG resistor. In some embodiments, the resistor 50d may have a 2DEG region. In some embodiments, the capacitor 50e may be a metal-insulator-metal (MIM) capacitor.

In some embodiments, the electronic device 50 is a horizontal/transverse electronic device. That is, the functional components in the electronic device 50 are of horizontal/transverse structures. In some embodiments, in the power devices 50a and 50b, the current flow directions are parallel to the surface of the structure.

For example, an arrow D1 is horizontal. The arrow D1 is transverse. An arrow D2 is vertical. The arrow D2 is longitudinal. The arrow D1 is vertical to the arrow D2. The vertical direction is the stacking direction of the substrate 52 and the III-V layer 54 of the electronic device 50. The horizontal direction is roughly parallel to the surface 52s of the substrate 52 and the surface 54s of the III-V layer 54. The current flows in a direction shown by the arrow D1 in FIG. 1. The current flow direction is parallel to the surface 54s of the III-V layer 54. The current flow direction is parallel to the surface 52s of the substrate 52.

In some embodiments, the electronic device 50 is a discrete electronic device. That is, the components in the electronic device 50 are each formed independently in a die. The discrete electronic devices are conducive to formation of integrated electronic devices. For example, the discrete electronic devices are further integrated with other devices, and/or a plurality of electronic devices 50 are integrated with each other.

Figure 2:
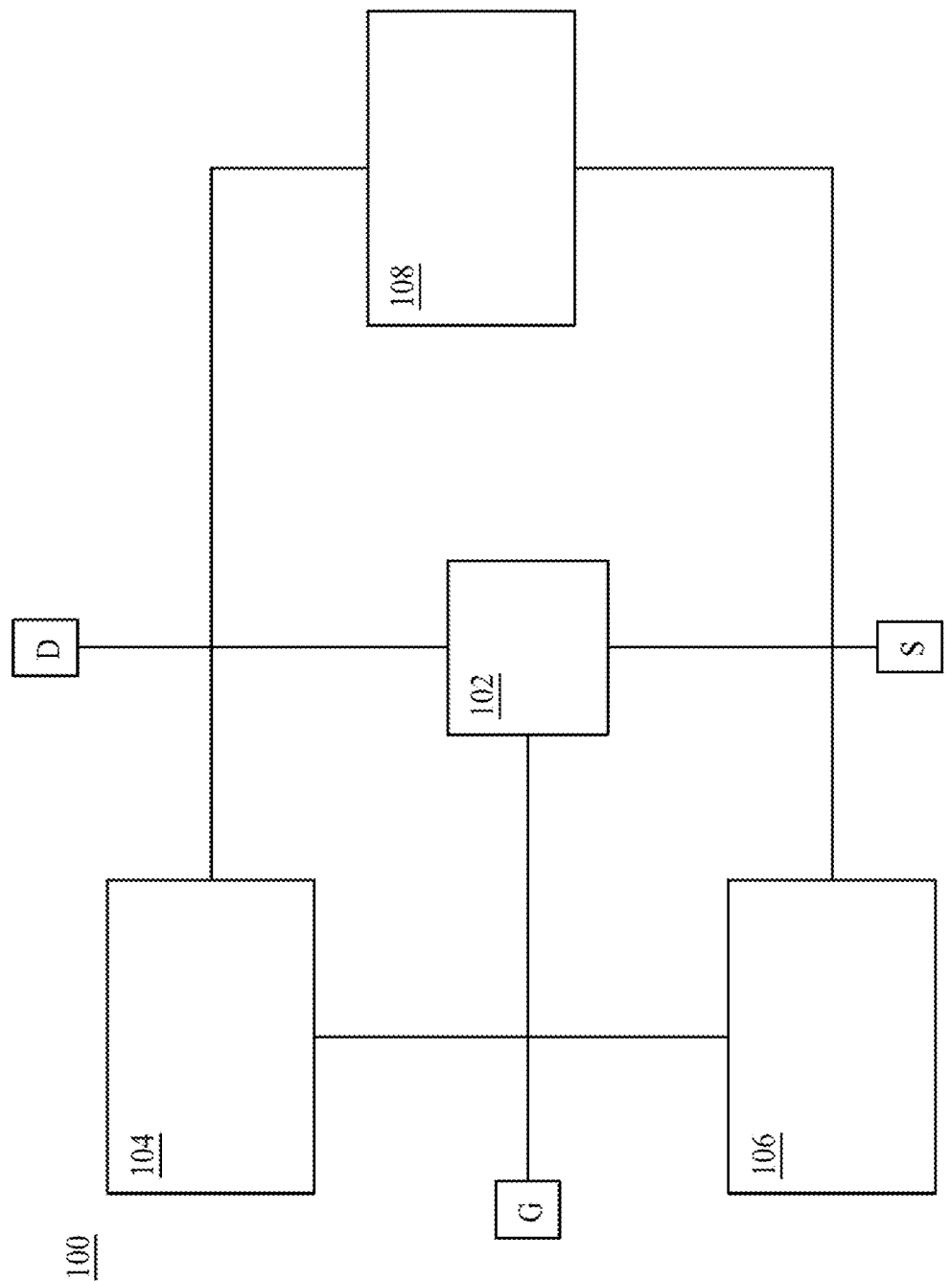
FIG. 2 is a schematic illustration of a circuit according to some embodiments of the disclosure.

FIG. 2 is a schematic illustration of a circuit 100. The circuit 100 may have the structure of the electronic device 50 shown in FIG. 1. As shown in FIG. 2, the circuit 100 includes a power device 102 which has three end points. In some embodiments, the power device 102 includes a source S, a drain D and a gate G. In some embodiments, the power device 102 may be the transistors 50a and/or 50b as shown in FIG. 1. In some embodiments, the power device 102 may be HEMT. In some embodiments, the power device 102 may be horizontal/transverse HEMT.

The circuit 100 also includes electrostatic protection circuits 104, 106 and 108. In this disclosure, the electrostatic protection circuit may also be referred to as an electrostatic discharge (ESD) protection circuit, or called a circuit for short.

As shown in FIG. 2, the electrostatic protection circuits 104, 106 and 108 are connected to the two end points of the power device 102. For example, the electrostatic protection circuit 104 is connected between the drain D and the gate G of the power device 102. The electrostatic protection circuit 106 is connected between the gate G and the source S of the power device 102. The electrostatic protection circuit 108 is connected between the source S and the drain D of the power device 102. The electrostatic protection circuits 104, 106 and 108 are configured to allow bilateral electrostatic protection between the two end points of the power device 102. For example, the power device 102 may discharge static electricity from the drain D to the gate G or from the gate G to the drain D through the electrostatic protection circuit 104. For example, the power device 102 may discharge static electricity from the source S to the gate G or from the gate G to the source S through the electrostatic protection circuit 106. For example, the power device 102 may discharge static electricity from the source S to the drain D or from the drain D to the source S through the electrostatic protection circuit 108.

Next, the detailed circuit compositions and circuit operation modes of the electrostatic protection circuits 104, 106 and 108 are described with reference to drawings. However, the following description is only an example, and this disclosure is not limited thereto. The variations, replacements and changes of the embodiments described in the disclosure may be made without departing from the spirit and scope of the disclosure.

According to some embodiments of the disclosure, FIGS. 3A, 3B, 3C, 3D, 3E, and 3F show a circuit diagram of a circuit 100 of FIG. 2 and a schematic illustration of an ESD current path of the circuit 100.

Figure 3A:
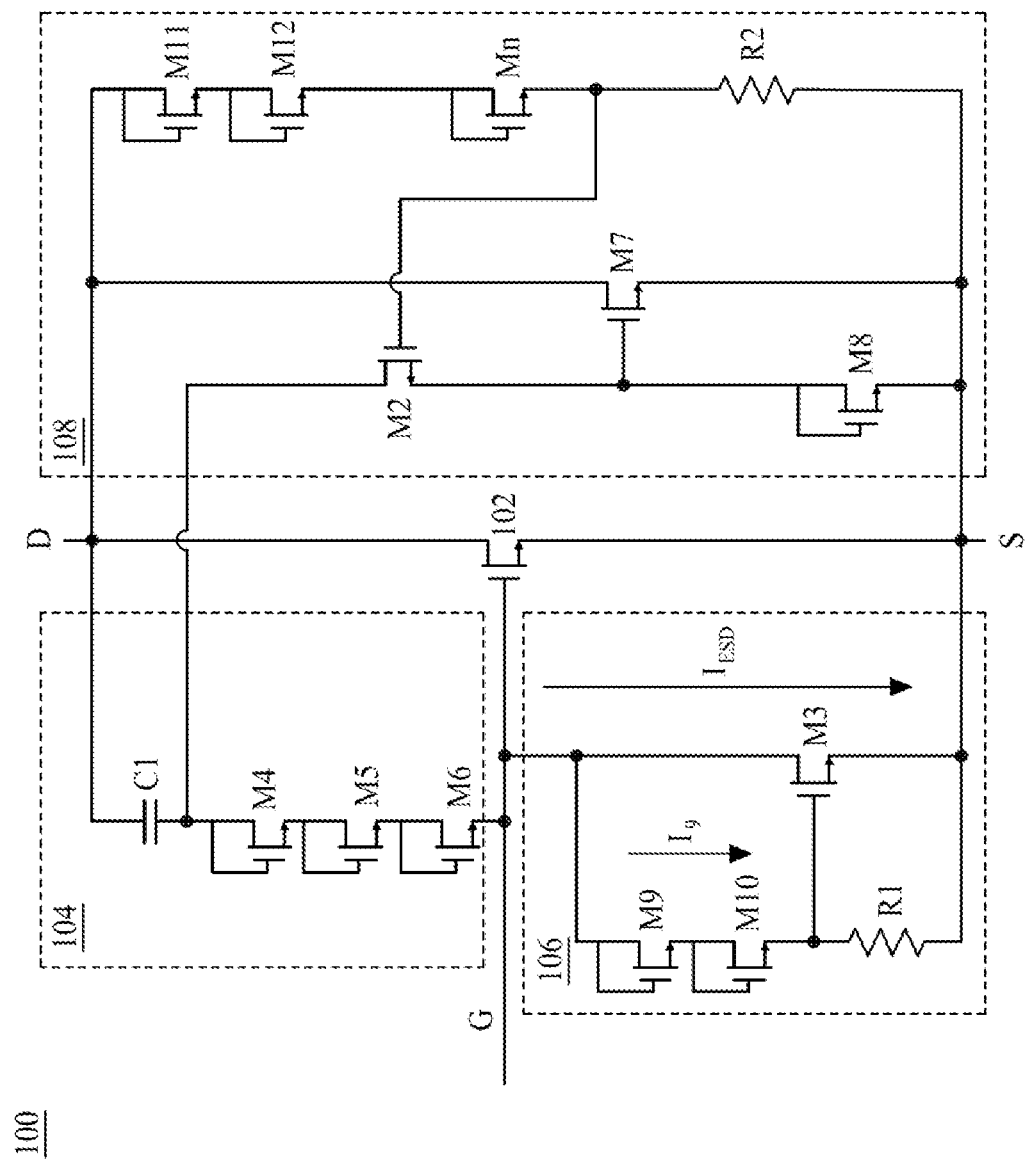
FIG. 3A, FIG. 3B, FIG. 3C, FIG. 3D, FIG. 3E and FIG. 3F are schematic illustrations of circuits and electrostatic discharge (ESD) current paths of the circuits according to some embodiments of the disclosure.

Referring to FIG. 3A, the circuit 100 includes the power device 102 and the electrostatic protection circuits 104, 106 and 108. In some embodiments, the power device 102 is the horizontal/transverse HEMT. In some embodiments, the power device 102 may include an arbitrary quantity of horizontal/transverse HEMTs or any other power circuits. The power device 102 includes a drain D, a gate G and a source S.

The electrostatic protection circuit 104 includes transistors M4, M5, M6 and a capacitor C1. The transistors M4, M5 and M6 are transistors formed by connecting the gates and the drains. The transistors M4, M5 and M6 are connected in series. The transistor M6 includes a gate, a source and a drain. The source of the transistor M6 is connected to the gate of the power device 102, and the gate of the transistor M6 is connected to the drain of the transistor M6. The transistor M5 includes a gate, a source and a drain. The source of the transistor M5 is connected to the drain and the gate of the transistor M6, and the gate of the transistor M5 is connected to the drain of the transistor M5. The transistor M4 includes a gate, a source and a drain. The source of the transistor M4 is connected to the drain and the gate of the transistor M5, and the gate of the transistor M4 is connected to the drain of the transistor M4. The capacitor C1 is connected between the drain of the transistor M4 and the drain D of the power device 102.

In some embodiments, the transistors M4, M5, and M6 connected in series may be used as resistors to provide a voltage difference between the drain of the transistor M4 and the source of the transistor M6. Although the electrostatic protection circuit 104 shown in the drawing includes three transistors, the disclosure is not limited thereto. In some embodiments, the electrostatic protection circuit 104 may include two, four, or other quantities of transistors.

The electrostatic protection circuit 106 includes transistors M3, M9 and M10 and a resistor R1. The transistors M9 and M10 are transistors formed by connecting the gates and the drains. The transistors M9 and M10 are connected in series between the drain and the gate of the transistor M3. The transistor M3 includes a gate, a source and a drain. The source of the transistor M3 is connected to the source S of the power device 102. The drain of the transistor M3 is connected to the gate G of the power device 102. The gate of the transistor M3 is connected to the source of the transistor M10 and the resistor R1. The transistor M10 includes a gate, a source and a drain. The source of the transistor M10 is connected to the gate of the transistor M3 and the resistor R1, and the drain of the transistor M10 is connected to the gate of the transistor M10. The transistor M9 includes a gate, a source and a drain. The source of the transistor M9 is connected to the drain and the gate of the transistor M10, and the drain of the transistor M9 is connected to the gate G of the power device 102. The resistor R1 is connected between the gate of the transistor M3 and the source S of the power device 102.

Although the electrostatic protection circuit 106 shown in the drawing includes two transistors, the disclosure is not limited thereto. In some embodiments, the electrostatic protection circuit 106 may include three, four, or other quantities of transistors.

The electrostatic protection circuit 108 includes transistors M2, M7, M8, M11, M12 . . . Mn, and a resistor R2. The transistor M2 includes a gate, a source and a drain. The source of the transistor M2 is connected to the gate of the transistor M7, as well as the drain and the gate of the transistor M8. The gate of the transistor M2 is connected to the source of the transistors M11, M12 . . . Mn and the resistor R2. The drain of the transistor M2 is connected to the capacitor C1 as well as the drain and the gate of the transistor M4. The source of the transistor M8 is connected to the source S of the power device 102. The gate of the transistor M8 is connected to the drain of the transistor M8. The source of the transistor M7 is connected to the source S of the power device 102. The gate of the transistor M7 is connected to the drain of the transistor M8 and the source of the transistor M2. The drain of the transistor M7 is connected to the drain D of the power device 102. The transistors M11, M12 . . . Mn are transistors formed by connecting the gates and the drains. The transistors M11, M12 . . . Mn are connected in series. The sources of the transistors M11, M12 . . . Mn are connected to the resistor R2 and the gate of the transistor M2. The drains of transistors M11, M12 . . . Mn are connected to the gates of the transistors M11, M12 . . . Mn. The drains of the transistors M11, M12 . . . Mn are connected to the drain D of the power device 102. The transistors M11, M12 . . . Mn may include two, three, four, or other quantities of transistors. The resistor R2 is connected between the sources of the transistors M11, M12 . . . Mn and the source of the transistor M7.

The electrostatic protection circuits 104, 106 and 108 can only work when an ESD event occurs. Furthermore, the ESD circuit cannot interfere with the normal work of a chip. For example, parasitic parameters (such as parasitic capacitance) introduced by the ESD circuit cannot affect the performance of the chip.

For example, in some embodiments, the breakdown voltage $V_{GS\_breakdown}$ of $V_{GS}$ of the power device 102 is about 8-10 V, and the operating voltage $V_{GS\_operating}$ of $V_{GS}$ is about 5 V. Therefore, the design window of the electrostatic protection circuit is very narrow, the trigger voltage $V_{trigger}$ of the electrostatic protection circuit should meet $V_{GS\_operating} < V_{trigger} < V_{GS\_breakdown}$. The electrostatic protection circuit shall effectively protect the gate G of the power device 102 from being damaged, and shall not increase the electric leakage of the gate G, or else the switching speed of the power device 102 is reduced and the switching loss is increased.

As shown in FIG. 3A, after ESD discharge is borne between the gate G and the source S of the power device 102 so that the voltage of the gate G of the power device 102 is higher than the predetermined voltage value of the source S of the power device 102, the transistors M9 and M10 are conducted. A current $I_9$ charges the gate of the transistor M3 through the transistor M9 and the transistor M10, the transistor M3 is conducted due to a fact that the voltage $V_{GS}$ between the gate and the source of the transistor M3 is greater than a threshold voltage $V_{th}$ (for example about 1.5 V), and the accumulated charge is discharged from the gate G to the source S of the power device 102 via the transistor M3 by virtue of a current $I_{ESD}$.

Figure 3B:
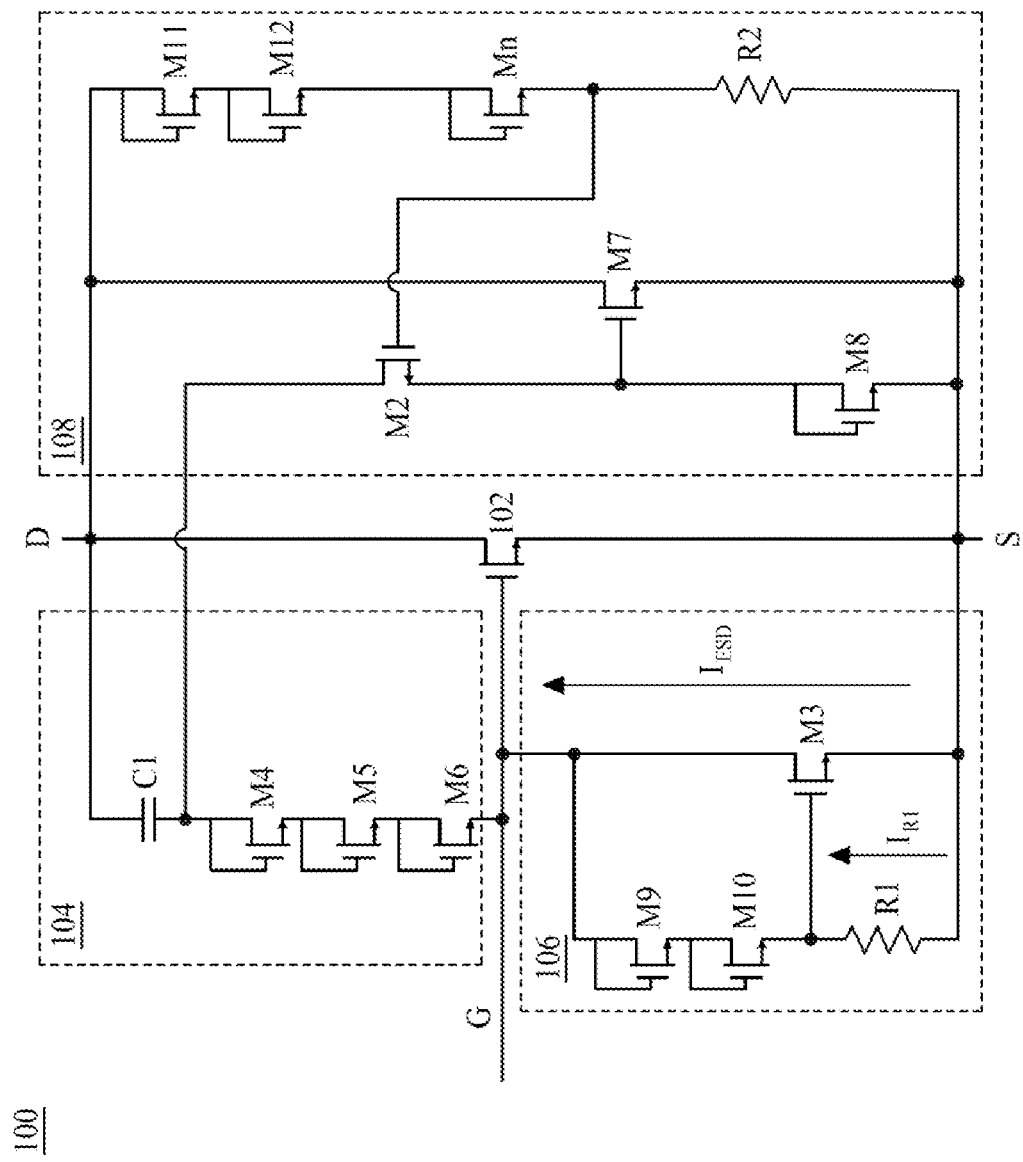

Referring to FIG. 3B, after ESD discharge is borne between the gate G and the source S of the power device 102 so that the voltage of the source S of the power device 102 is higher than the predetermined voltage value of the gate G of the power device 102, the transistor M9 and the transistor M10 are not conducted due to reverse bias, a current $I_{R1}$ charges the gate of the transistor M3 through the resistor R1, the transistor M3 is conducted, and the accumulated charge is discharged from the source S to the gate G of the power device 102 via the transistor M3 by virtue of the current $I_{ESD}$.

Figure 3C:
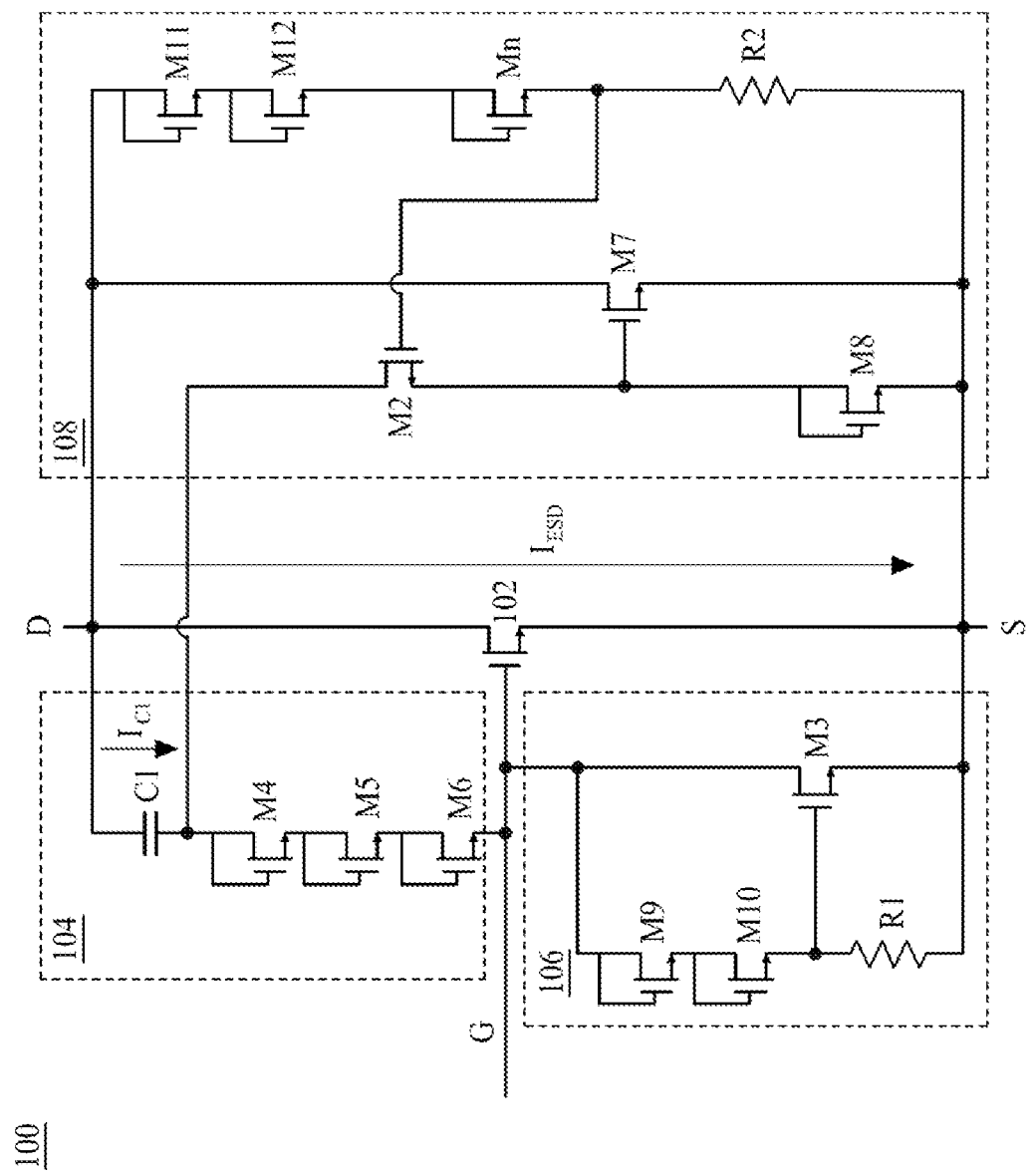

Referring to FIG. 3C, after ESD discharge is borne between the gate D and the source S of the power device 102 so that the voltage of the drain D of the power device 102 is higher than the predetermined voltage value of the source S of the power device 102, a current $I_{C1}$ charges the gate G of the power device 102 through capacitor C1 coupling, the power device 102 is conducted due to a fact that the voltage $V_{GS}$ between the gate and the source is larger than a threshold voltage $V_{th}$ (for example about 1.5 V), and the accumulated charge is discharged from the drain D to the source S of the power device 102 via the power device 102 by virtue of the current $I_{ESD}$.

Figure 3D:
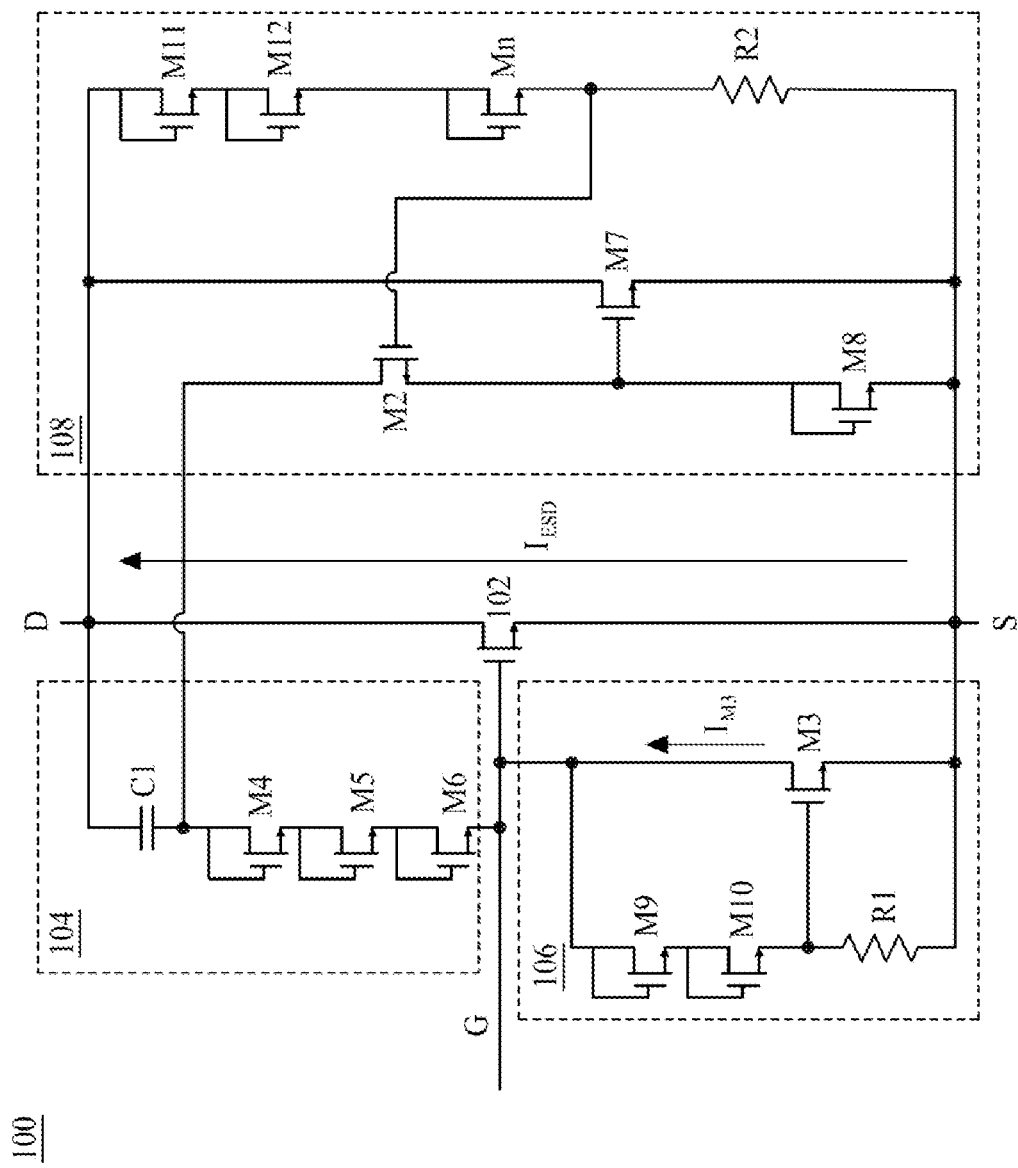

Referring to FIG. 3D, after ESD discharge is borne between the gate D and the source S of the power device 102 so that the voltage of the source S of the power device 102 is higher than the predetermined voltage value of the drain D of the power device 102, the transistor M4, transistor M5, transistor M6, transistor M9 and transistor M10 are not conducted due to reverse bias. The current $I_{R1}$ charges the gate of the transistor M3 through the resistor R1, and the transistor M3 is conducted reversely. A current $I_{M3}$ charges the gate of the power device 102 through the transistor M3, the power device 102 is conducted due to a fact that the voltage $V_{GD}$ between the gate and the drain of the power device 102 is greater than the threshold voltage $V_{th}$, and the accumulated charge is discharged from the source S to the drain D of the power device 102 via the power device 102 by virtue of the current $I_{ESD}$.

Figure 3E:
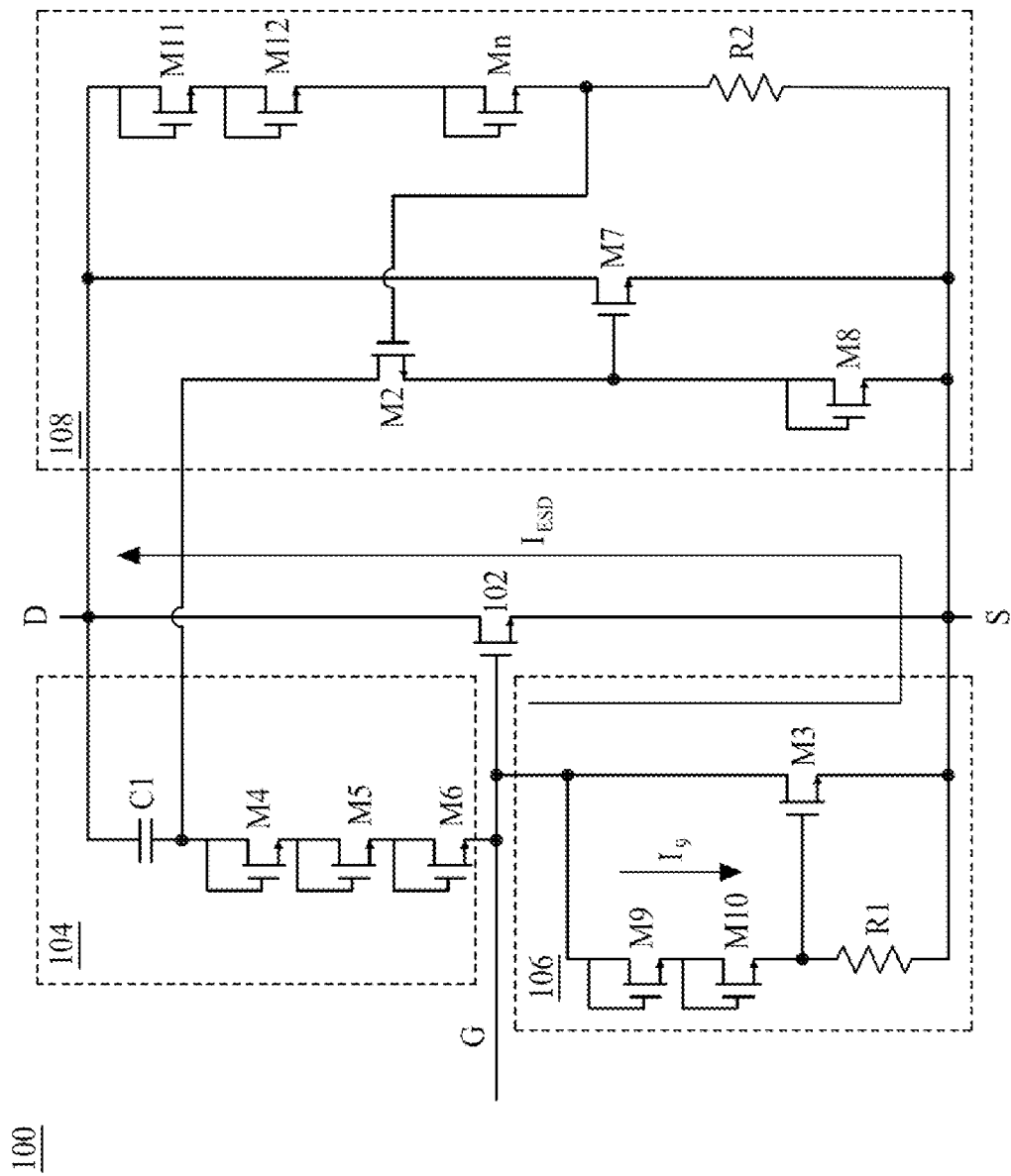

Referring to FIG. 3E, after ESD discharge is borne between the gate D and the source G of the power device 102 so that the voltage of the gate G of the power device 102 is higher than the predetermined voltage value of the drain D of the power device 102, a current $I_{M9}$ charges the gate of the transistor M3 through the transistor M9 and transistor M10, and the transistor M3 is conducted. The accumulated charge is discharged from the gate G to the drain D of the power device 102 via the transistor M3 and the power device 102 by virtue of the current $I_{ESD}$.

Figure 3F:
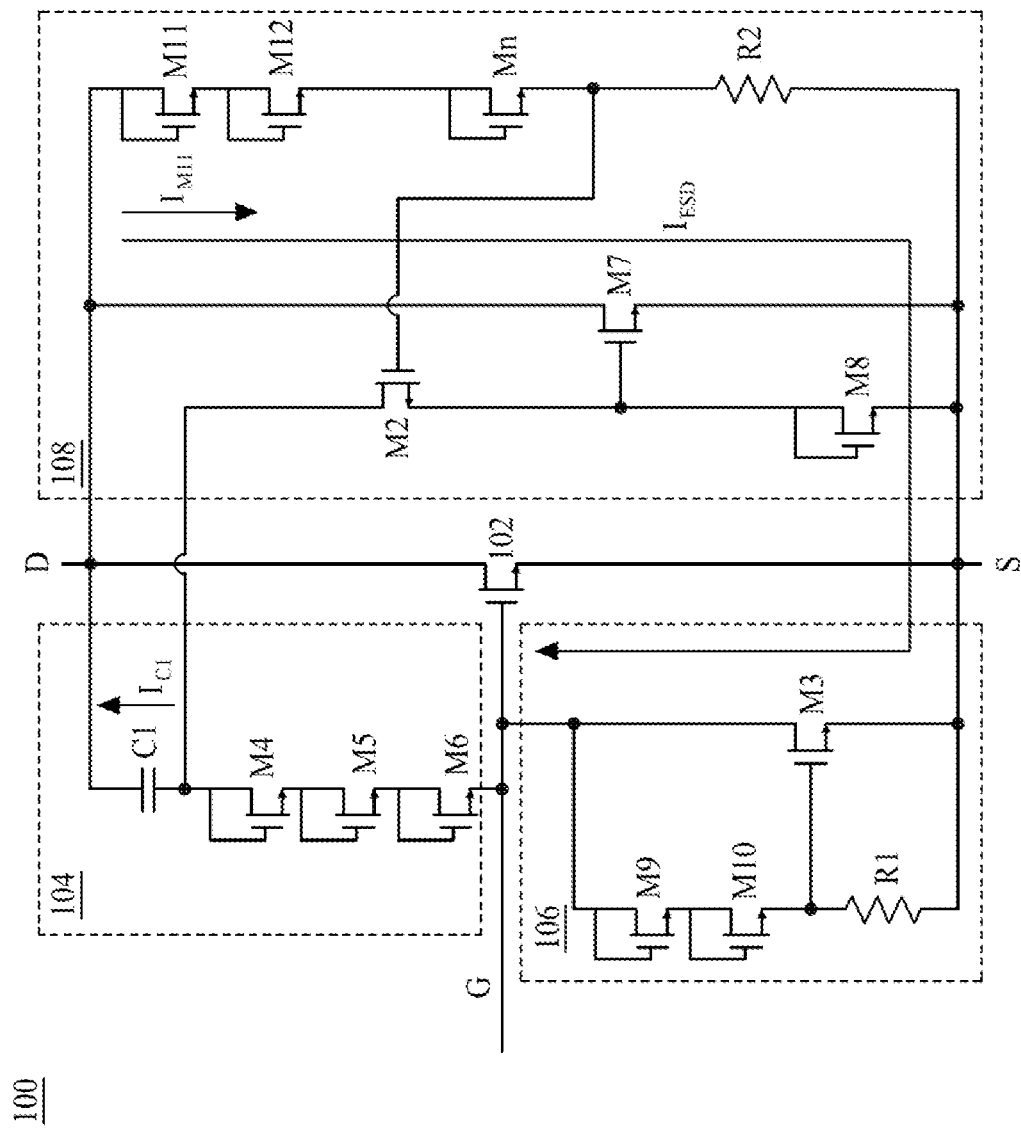

Referring to FIG. 3F, after ESD discharge is borne between the gate D and the source G of the power device 102 so that the voltage of the drain D of the power device 102 is higher than the predetermined voltage value of the gate G of the power device 102 and the ESD voltage between the drain D and the source S of the power device 102 is higher than the operating voltage $V_{DS\_operating}$ of $V_{DS}$ of the power device 102, which is caused by charge accumulation of the electrostatic protection circuit, the transistors M11, M12 . . . Mn are conducted, a current $I_{M11}$ charges the gate of the transistor M13 through the transistors M11, M12 . . . Mn, and the transistor M13 is conducted. The coupling current $I_{C1}$ runs through the capacitor C1 and charges the gate of the transistor M7, and the transistor M7 is conducted. The accumulated charge is discharged from the drain D to gate G of the power device 102 via the transistor M7 and the transistor M3 by virtue of the current $I_{ESD}$. According to some embodiments of the disclosure, the transistors M11, M12 . . . Mn and the resistor R2 may be used to determine whether the operating voltage $V_{DS\_operating}$ of $V_{DS}$ of the power device 102 is greater than the max operating voltage to prevent false triggering of ESD protection during the normal operation of the power device 102 to conduct the transistor M7.

Figure 4A:
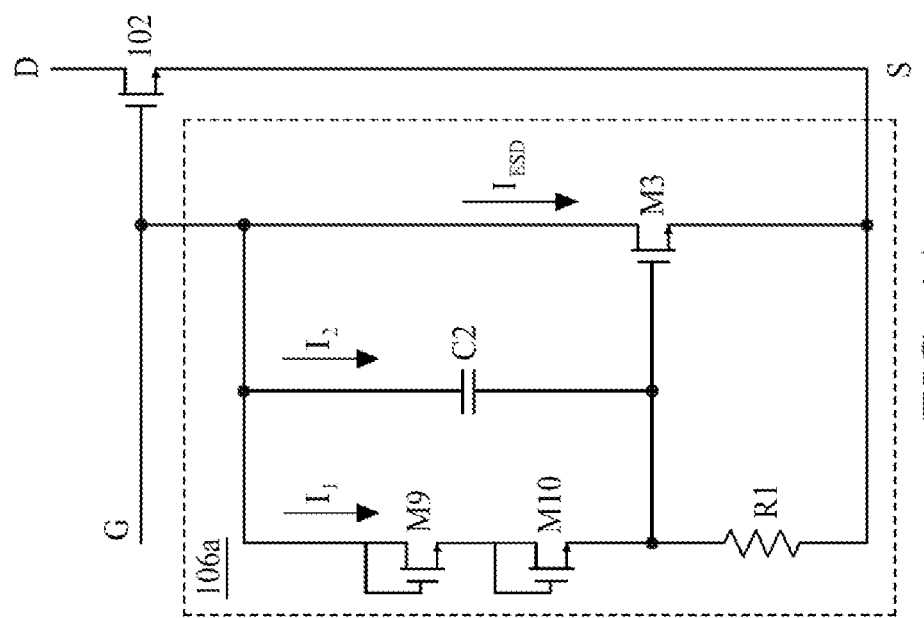
FIG. 4A and FIG. 4B are schematic illustrations of circuits and ESD current paths of the circuits according to some embodiments of the disclosure.
Figure 4B:
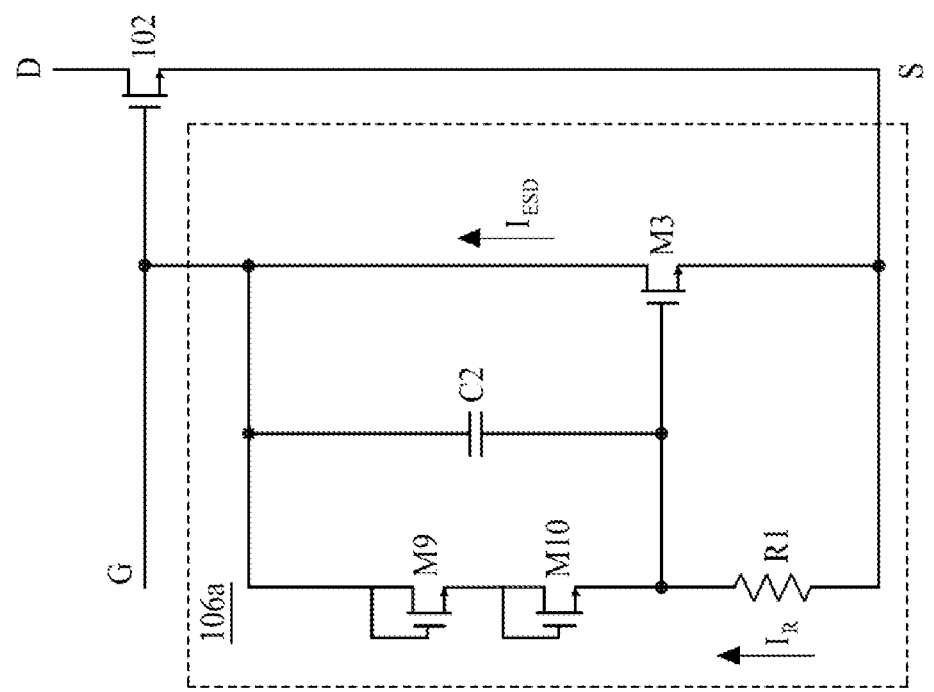

FIG. 4A and FIG. 4B are schematic illustrations of circuits and ESD current paths of the circuits according to some embodiments of the disclosure. For the sake of simplicity, in FIG. 4A and FIG. 4B, the electrostatic protection circuits 104 and 108 are omitted and the electrostatic protection circuit 106a connected between the gate G and the source S of the power device 102 is only described. The electrostatic protection circuit 106a in the embodiment is similar to the electrostatic protection circuit 106 in FIG. 3A to FIG. 3F, and one of differences is that the electrostatic protection circuit 106a also includes a capacitor C2 connected between the drain and the gate of the transistor M3. The capacitor C2 is connected with the transistor M9 and the transistor M10 in parallel. The capacitor C2 may be used as a buffer path for an ESD current. The capacitance value of the capacitor C2 in the embodiment may be selected to further adjust the charging path of the transistor M3 and reduce voltage spike. Although the electrostatic protection circuit 106a shown in the drawing includes two transistors, the disclosure is not limited thereto. In some embodiments, the electrostatic protection circuit 106a may include three, four, or other quantities of transistors.

Referring to FIG. 4A, after ESD discharge is borne between the gate S and the source G of the power device 102 so that the voltage of the gate G of the power device 102 is higher that the predetermined voltage value of the source S of the power device 102, the transistors M9 and M10 are conducted. A current $I_1$ charges the gate of the transistor M3 through the transistor M9 and the transistor M10, and a current $I_2$ charges the gate of the transistor M3 through the capacitor C2 coupling. In some embodiments, the current $I_1$ is far smaller than the current $I_2$. The current $I_1$ and the current $I_2$ make the voltage $V_{GS}$ between the gate and the source of the transistor M3 larger than the threshold voltage $V_{th}$ (for example about 1.5 V) so that the transistor M3 is conducted. The accumulated charge is discharged from the gate G to the source S of the power device 102 via the transistor M3 by virtue of the current $I_{ESD}$.

Referring to FIG. 4B, after ESD discharge is borne between the gate G and the source S of the power device 102 so that the voltage of the source S of the power device 102 is higher than the predetermined voltage value of the gate G of the power device 102, the transistor M9 and the transistor M10 are not conducted due to reverse bias. The current $I_{R1}$ charges the gate of the transistor M3 through R1, the transistor M3 is conducted, and the accumulated charge is discharged from the source S to the gate G of the power device 102 via transistor M3 by virtue of the current $I_{ESD}$.

Figure 5:
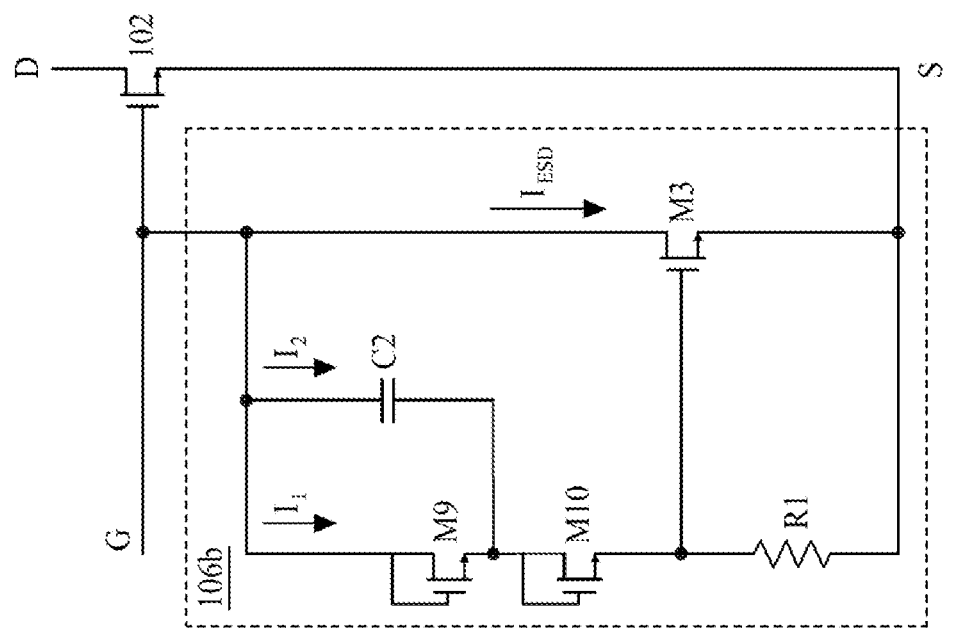
FIG. 5 is a schematic illustration of a circuit and an ESD current path of the circuit according to some embodiments of the disclosure.

FIG. 5 is a schematic illustration of a circuit and an ESD current path of the circuit according to some embodiments of the disclosure. For the sake of simplicity, in FIG. 5, the electrostatic protection circuits 104 and 108 are omitted and the electrostatic protection circuit 106b connected between the gate G and the source S of the power device 102 is only described. The circuit of the embodiment is similar to the electrostatic protection circuit 106a in FIG. 4A and FIG. 4B, and one of differences is that the capacitor C2 of the electrostatic protection circuit 106b is connected with the transistor M9 in parallel and connected with the transistor M10 in series. The ESD current path of the embodiment may refer to FIG. 4A to FIG. 4B and related paragraphs.

When the trigger voltage $V_{trigger}$ of the electrostatic protection circuit 106b is between the operating voltage $V_{GS\_operating}$ of the voltage $V_{GS}$ between the gate and the source of the power device 102 and the breakdown voltage $V_{GS\_breakdown}$ of $V_{GS}$, namely, $V_{GS\_operating} < V_{trigger} < V_{GS\_breakdown}$, the current $I_1$ is very small, the capacitor $C_2$ is in an open circuit, $V_{GS\_operating} < V_{th9} + V_{th10} + V_{th3}$ (threshold voltages of the transistors M9, M10 and M3), the transistors M9, M10 and M3 are not conducted, and gate leakage current is not enlarged. When the voltage continues to be enlarged, $I_1$ becomes larger. If $I_1R$ is larger than the threshold voltage $V_{th}$ of the transistor M3, the transistor M3 is conducted and an ESD current is discharged from the gate G to the source S via the transistor M3. The conduction of the transistor M3 may take an effect of clamping the $V_{GS}$ and ensure that $V_{GS}$ does not exceed $V_{GS\_breakdown}$. Therefore, the embodiment can effectively protect the gate from being damaged by ESD voltage spike, and can also perform clamping protection on $V_{GS}$.

Figure 6:
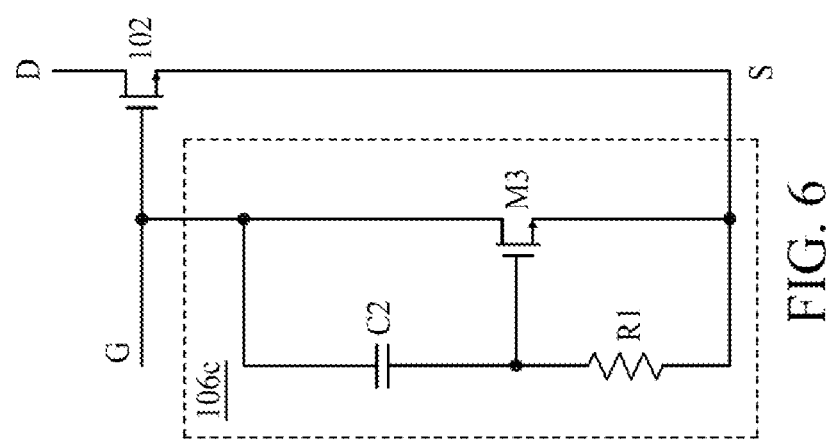
FIG. 6 shows a circuit according to some embodiments of the disclosure.

FIG. 6 shows a circuit according to some embodiments of the disclosure. For the sake of simplicity, in FIG. 6, the electrostatic protection circuits 104 and 108 are omitted and the electrostatic protection circuit 106c connected between the gate G and the source S of the power device 102 is only described. The electrostatic protection circuit 106c of the embodiment is similar to the electrostatic protection circuit 106a in FIG. 4A and FIG. 4B, but one of differences is that the electrostatic protection circuit 106c does not include the transistor M9 and/or the transistor M10. The electrostatic protection circuit 106c includes a capacitor C2 connected between the drain and gate of the transistor M3. The capacitor C2 is connected between the gate of the transistor M3 and the gate G of the power device 102. The embodiment utilizes the capacitor C2 to replace the transistor M9 and/or the transistor M10 so as to reduce the possibility of a leakage current of the transistor M9 and/or the transistor M10.

After ESD discharge is borne between the gate S and the source G of the power device 102 so that the voltage of the gate G of the power device 102 is higher than the predetermined voltage value of the source S of the power device 102, the ESD current charges the gate of the transistor M3 through capacitor C2 coupling, the transistor M3 is conducted due to a fact that the voltage $V_{GS}$ between the gate and the source of the transistor M3 is larger than the threshold voltage $V_{th}$, and the accumulated charge is discharged from the gate G to the source S of the power device 102 via the transistor M3.

After ESD discharge is borne between the gate G and the source S of the power device 102 so that the voltage of the source S of the power device 102 is higher than the predetermined voltage value of the gate G of the power device 102, the current charges the gate of the transistor M3 through the resistor R1, the transistor M3 is conducted, and the accumulated charge is discharged from the source S to the gate G of the power device 102 via the transistor M3.

Figure 7:
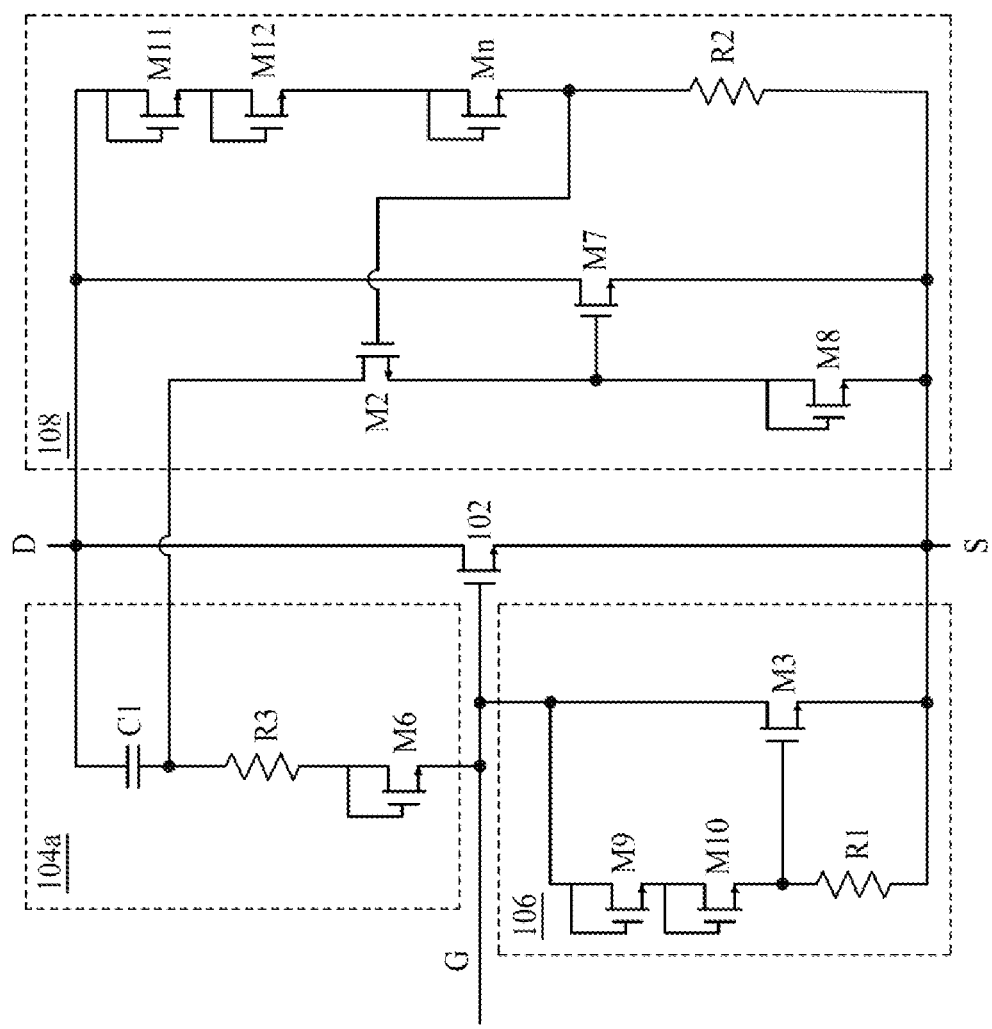
FIG. 7 shows a circuit according to some embodiments of the disclosure.

FIG. 7 shows a circuit according to some embodiments of the disclosure. The circuit of the embodiment is similar to that of FIG. 3A to FIG. 3F, but one of differences is that in the embodiment, the electrostatic protection circuit 104a connected between drain D and the gate G of the power device 102 has a resistor R3 connected in series with the transistor M6 and the capacitor C1. The resistor R3 is connected between the capacitor C1 and the drain of the transistor M6. The resistor R3 is connected between the drain of the transistor M13 and the drain of the transistor M6. The embodiment uses the resistor R3 to replace partial transistors (for example the transistor M4 and the transistor M5 in FIG. 3A to FIG. 3F are replaced) to provide a voltage drop. In some embodiments, the electrostatic protection circuit 104a includes at least one transistor. The ESD current path of the embodiment may refer to FIG. 3A to FIG. 3F and related paragraphs.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A circuit, comprising a first electrostatic (ESD) protection circuit, wherein the first electrostatic protection circuit is connected to a first end point and a second end point of a power device, and the first electrostatic protection circuit is configured to allow bilateral electrostatic protection between the first end point and the second end point of the power device, and wherein the power device comprises a transverse high-electron-mobility transistor (HEMT), wherein the first electrostatic protection circuit further comprises:
- a first transistor having a source, a gate and a drain, wherein the source of the first transistor is connected to the first end point of the power device, and the gate of the first transistor is connected to the drain of the first transistor;
- a second transistor having a source, a gate and a drain, wherein the source of the second transistor is connected to the first end point of the power device, the gate of the second transistor is connected to the drain of the first transistor, and the drain of the second transistor is connected to the second end point of the power device;
- a third transistor having a source, a gate and a drain, wherein the drain of the third transistor is connected to the second end point of the power device; and
- a first resistor connected between the source of the third transistor and the first end point of the power device;
- wherein the first end point of the power device is the source of the transverse HEMT, and the second end point of the power device is the drain of the transverse HEMT;
- wherein the circuit further comprises:
  - a second ESD protection circuit, wherein the second ESD protection circuit comprises:
    - a fourth transistor having a source, a gate and a drain, wherein the source of the fourth transistor is connected to a third end point of the power device, and the gate of the fourth transistor is connected to the drain of the fourth transistor; and
    - a capacitor connected between the drain of the fourth transistor and the second end point of the power device;
    - wherein the third end point of the power device is the gate of the transverse HEMT.

2. The circuit according to claim 1, wherein the second electrostatic protection circuit further comprises:
- a fifth transistor having a source, a gate and a drain, wherein the source of the fifth transistor is connected to the drain of the fourth transistor, and the gate of the fifth transistor is connected to the drain of the fifth transistor; and
- a sixth transistor having a source, a gate and a drain, wherein the source of the sixth transistor is connected to the drain of the fifth transistor, and the gate of the sixth transistor is connected to the drain of the sixth transistor.

3. The circuit according to claim 2, further comprising:
a second resistor connected between the capacitor and the drain of the fourth transistor.

4. The circuit according to claim 1, further comprising:
a third electrostatic protection circuit, and the third electrostatic protection circuit comprises:
- a seventh transistor having a source, a gate and a drain, wherein the source of the seventh transistor is connected to the first end point of the power device, and the drain of the seventh transistor is connected to the third end point of the power device; and
- a second resistor connected between the source of the seventh transistor and the gate of the seventh transistor;
- wherein the third end point of the power device is the gate of the transverse HEMT.

5. The circuit according to claim 4, further comprising:
- a fifth transistor having a source, a gate and a drain, wherein the source of the fifth transistor is connected to the gate of the seventh transistor, and the gate of the fifth transistor is connected to the drain of the fifth transistor; and
- a sixth transistor having a source, a gate and a drain, wherein the source of the sixth transistor is connected to the drain of the fifth transistor, and the gate of the sixth transistor is connected to the drain of the sixth transistor and the third end point of the power device.

6. The electrostatic protection circuit according to claim 4, further comprising:
a capacitor connected between the gate of the seventh transistor and the third end point of the power device.

7. The circuit according to claim 1, further comprising a III-V layer with at least one two-dimensional electron gas (2DEG) region formed in the III-V layer, wherein the 2DEG region is applied to the transverse HEMT.

8. The circuit according to claim 7, further comprising a conductor structure on the III-V layer, wherein the first electrostatic protection circuit is connected to the first end point and the second end point through the conductor structure.

9. A circuit, comprising:
a first electrostatic protection circuit, wherein the first electrostatic protection circuit is connected to a first end point and a second end point of a power device, and the first electrostatic protection circuit is configured to allow bilateral electrostatic protection between the first end point and the second end point of the power device, and wherein the power device comprises a transverse high-electron-mobility transistor (HEMT), wherein the first electrostatic protection circuit further comprises:
- a first transistor having a source, a gate and a drain, wherein the source of the first transistor is connected to the first end point of the power device, and the gate of the first transistor is connected to the drain of the first transistor;
- a second transistor having a source, a gate and a drain, wherein the source of the second transistor is connected to the first end point of the power device, the gate of the second transistor is connected to the drain of the first transistor, and the drain of the second transistor is connected to the second end point of the power device;
- a third transistor having a source, a gate and a drain, wherein the drain of the third transistor is connected to the second end point of the power device; and
- a first resistor connected between the source of the third transistor and the first end point of the power device;
- wherein the first end point of the power device is the source of the transverse HEMT, and the second end point of the power device is the drain of the transverse HEMT;
- wherein the circuit further comprises:
  - a fourth transistor having a source, a gate and a drain, wherein the source of the fourth transistor is connected to the drain of the first transistor, and the gate of the fourth transistor is connected to the source of the third transistor;
  - a fifth transistor having a source, a gate and a drain, wherein the source of the fifth transistor is connected to a third end point of the power device, and the gate of the fifth transistor is connected to the drain of the fifth transistor, wherein the third end point of the power device is the gate of the transverse HEMT; and
a second resistor connected between the drain of the fourth transistor and the drain of the fifth transistor.

10. An electronic device, comprising:
a power device comprising a transverse high-electron-mobility transistor (HEMT) having three end points; and
a first electrostatic discharge (ESD) protection circuit connected between at least two of three end points of the power device, and configured to provide a bilateral current path between the two end points, wherein the first ESD protection circuit comprises:
  a first transistor having a source, a gate and a drain, wherein the source of the first transistor is connected to the first end point of the power device, and the gate of the first transistor is connected to the drain of the first transistor;
  a second transistor having a source, a gate and a drain, wherein the source of the second transistor is connected to the first end point of the power device, the gate of the second transistor is connected to the drain of the first transistor, and the drain of the second transistor is connected to the second end point of the power device;
  a third transistor having a source, a gate and a drain, wherein the drain of the third transistor is connected to the second end point of the power device; and
  a first resistor connected between the source of the third transistor and the first end point of the power device;
  wherein the first end point of the power device is the source of the transverse HEMT, and the second end point of the power device is the drain of the transverse HEMT;
wherein the electronic device further comprises:
  a second ESD protection circuit, wherein the second ESD protection circuit comprises:
    a fourth transistor having a source, a gate and a drain, wherein the source of the fourth transistor is connected to the third end point of the power device, and the gate of the fourth transistor is connected to the drain of the fourth transistor; and
    a capacitor connected between the drain of the fourth transistor and the second end point of the power device;
    wherein the third end point of the power device is the gate of the transverse HEMT.

11. The electronic device according to claim 10, wherein the second ESD protection circuit further comprises:
  a second resistor connected between the capacitor and the drain of the fourth transistor.

12. The electronic device according to claim 10, further comprising:
  a third ESD protection circuit, wherein the third ESD protection circuit comprises:
    a seventh transistor having a source, a gate and a drain, wherein the source of the seventh transistor is connected to the first end point of the power device, and the drain of the seventh transistor is connected to the third end point of the power device;
    a second resistor connected between the source of the seventh transistor and the gate of the seventh transistor;
  wherein the third end point of the power device is the gate of the HEMT.

13. The electronic device according to claim 12, wherein the third ESD protection circuit further comprises:
  a fifth transistor having a source, a gate and a drain, wherein the source of the fifth transistor is connected to the gate of the seventh transistor, the gate of the fifth transistor is connected to the drain of the fifth transistor; and
  a sixth transistor having a source, a gate and a drain, wherein the source of the sixth transistor is connected to the drain of the fifth transistor, and the gate of the sixth transistor is connected to the drain of the sixth transistor and the third end point of the power device.

14. The electronic device according to claim 12, wherein the third ESD protection circuit further comprises:
  a capacitor connected between the gate of the seventh transistor and the third end point of the power device.

15. The electronic device according to claim 10, further comprising a III-V layer with at least one two-dimensional electron gas (2DEG) region formed in the III-V layer, wherein the transverse HEMT and the first ESD protection circuit share the same III-V layer.

16. The electronic device according to claim 15, further comprising a conductor structure on the III-V layer, wherein the first ESD protection circuit is connected to the at least two of three end points of the power device through the conductor structure.

* * * * *